United States Patent
Arduini et al.

(10) Patent No.: US 10,216,249 B2
(45) Date of Patent: Feb. 26, 2019

(54) ELECTRICAL POWER CONTROL AND FAULT PROTECTION

(71) Applicant: Cisco Technology, Inc., San Jose, CA (US)

(72) Inventors: Douglas Paul Arduini, San Ramon, CA (US); Jonathan Lee Smith, San Jose, CA (US); Joel Richard Goergen, Soulsbyville, CA (US); Marc Henry Mantelli, Los Gatos, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 207 days.

(21) Appl. No.: 15/277,560

(22) Filed: Sep. 27, 2016

(65) Prior Publication Data

US 2018/0088656 A1 Mar. 29, 2018

(51) Int. Cl.
| | |
|---|---|
| *G06F 1/32* | (2006.01) |
| *G06F 1/30* | (2006.01) |
| *H02H 3/05* | (2006.01) |
| *H02H 3/04* | (2006.01) |
| *H02H 7/30* | (2006.01) |
| *G01R 31/44* | (2006.01) |

(52) U.S. Cl.
CPC ........... *G06F 1/3237* (2013.01); *G01R 31/44* (2013.01); *G06F 1/305* (2013.01); *G06F 1/3253* (2013.01); *G06F 1/3287* (2013.01); *H02H 3/05* (2013.01); *H02H 3/044* (2013.01); *H02H 7/30* (2013.01)

(58) Field of Classification Search
None
See application file for complete search history.

(56) References Cited

U.S. PATENT DOCUMENTS

| | | | | |
|---|---|---|---|---|
| 4,517,161 | A | * 5/1985 | Gravina | G01N 27/122 324/71.5 |
| 6,975,944 | B1 | * 12/2005 | Zenhausern | G01N 33/0034 702/22 |
| 8,144,442 | B1 | 3/2012 | Heath et al. | |

(Continued)

OTHER PUBLICATIONS

"SMM766, Six-Channel Active DC Output Controller, Monitor, Marginer and Sequencer with Sequence-Link", Summit Microelectronics, Inc., Jan. 1, 2006, 32 pages.

(Continued)

*Primary Examiner* — Jaweed A Abbaszadeh
*Assistant Examiner* — Cheri L Harrington
(74) *Attorney, Agent, or Firm* — Johnson, Marcou & Isaacs, LLC (57) ABSTRACT

A fault processing subsystem of an electronics assembly, senses an alarm state at an output of a first power distribution element of multiple power distribution elements arranged in a hierarchy in the electronics assembly. The first element is at a level of the hierarchy other than the top level, and the alarm state corresponds to an output of the first element being different than an expected output of that element. The fault processing subsystem commands, in response to the sensing the alarm state, the first element to disable via a control input to the first element. In response to the fault processing subsystem thereafter sensing an alarm state at the power output of the commanded element, the fault processing subsystem commands an element at the next higher level in the hierarchy from the first element to disable.

14 Claims, 8 Drawing Sheets

(56) References Cited

U.S. PATENT DOCUMENTS

| | | | |
|---|---|---|---|
| 8,754,622 B2 | 6/2014 | Dobkin et al. | |
| 8,760,996 B2 | 6/2014 | Berkowitz et al. | |
| 9,760,452 B2* | 9/2017 | Kelly | G06F 11/2015 |
| 9,946,327 B2* | 4/2018 | Sugumar | G06F 1/324 |
| 2005/0273207 A1* | 12/2005 | Dougherty | G06F 1/12 |
| | | | 700/292 |
| 2009/0210735 A1* | 8/2009 | Brown | G06F 1/26 |
| | | | 713/330 |
| 2009/0228893 A1* | 9/2009 | Behrendt | G06F 1/206 |
| | | | 718/105 |
| 2010/0100254 A1* | 4/2010 | Artman | H05K 7/20836 |
| | | | 700/299 |
| 2010/0254058 A1* | 10/2010 | Kirchbaum | G06F 1/206 |
| | | | 361/103 |
| 2012/0098334 A1* | 4/2012 | Holmberg | G06F 1/32 |
| | | | 307/12 |
| 2013/0119962 A1* | 5/2013 | Holmberg | H02J 1/00 |
| | | | 323/304 |
| 2013/0159755 A1* | 6/2013 | Presant | G06F 1/206 |
| | | | 713/340 |
| 2013/0335043 A1* | 12/2013 | He | H02M 3/04 |
| | | | 323/234 |
| 2013/0345892 A1* | 12/2013 | Lin | G06F 1/206 |
| | | | 700/299 |
| 2014/0013167 A1* | 1/2014 | Yuuki | G06F 11/0751 |
| | | | 714/48 |
| 2015/0177813 A1* | 6/2015 | Bailey | G06F 1/3234 |
| | | | 713/320 |
| 2016/0063845 A1* | 3/2016 | Lloyd | G08B 21/187 |
| | | | 340/679 |
| 2016/0126717 A1 | 5/2016 | Valdes et al. | |
| 2016/0266176 A1* | 9/2016 | Holmberg | G01R 19/16528 |
| 2017/0185124 A1* | 6/2017 | Messick | G06F 1/263 |
| 2017/0185140 A1* | 6/2017 | Bailey | G06F 1/3296 |
| 2017/0242467 A1* | 8/2017 | Kelly | G06F 1/28 |
| 2018/0032120 A1* | 2/2018 | Maheswaran | G06F 1/30 |

OTHER PUBLICATIONS

Trifonov, "European Search Report and Search Opinion of EP 17192126.5", dated Apr. 24, 2018, 7 pages.

* cited by examiner

First sense, by a fault processing subsystem of an electronics assembly, an alarm state at an output of a first active power distribution element of a plurality of active power distribution elements arranged in a hierarchy in an electronics assembly, the first element being at a level of the hierarchy other than the top level, and the alarm state corresponding to an output of the first element different than an expected output of the first element by at least the sum of a regulation margin of the first element, a noise margin of the first element, and a measurement accuracy of the fault processing subsystem
410

First command, in response to the first sensing, by the fault processing subsystem in communication with a control input of each element, the first element sensed to be in the alarm state to disable
420

Second sense, by the fault processing subsystem, an alarm state at the power output of the first commanded element
430

Second command, by the fault processing subsystem, and in response to the second sensing, an element at the next higher level in the hierarchy from the first element second sensed to be in an alarm state to disable
440

ELECTRICAL POWER CONTROL AND FAULT PROTECTION

TECHNICAL FIELD

The disclosed technology relates to electrical power control and fault protection in electronics assemblies. More specifically, embodiments of the disclosed technology relate to power control and power fault protection in an electronics assembly with a hierarchical arrangement of power supply distribution elements.

BACKGROUND

A computer network is a telecommunications network that allows computers to exchange data. Network devices that originate, route, and terminate the data are called network nodes. Network nodes can include hosts, such as personal computers, phones, and servers, as well as networking devices, such routers and switches. In computer networks, network nodes pass data to each other along data connections. Data is typically transferred in the form of packets. Connections between network nodes are established using various media, such as fiber optic cable, coaxial cable, and wireless links.

Moore's Law, that the density of integrated circuits doubles every 18-24 months, continues to be roughly applicable to computer networks and networking devices. Both memory and compute resources continue to become physically smaller, faster, and more powerful; and, consequently, generate more heat. Further, the space available to host those resources, for example, space in an electronics assembly in a rack of a data center, becomes more valuable—so the resources are installed at an increasingly higher density.

BRIEF DESCRIPTION OF THE DRAWINGS

FIG. 5, comprising

DESCRIPTION OF EXAMPLE EMBODIMENTS

Overview

As networking devices, such as routers and switches, increase in capacity and complexity, while the processors and memory that the networking devices are built on increase in density and capability, the electrical power consumed by the networking devices increases, and the electrical power failure modes increase in both number and severity. Some currently projected networking device designs are predicted to host at least 10 front end power supplies, each rated at 3 kW—resulting in a 12 VDC power bus carrying a fault current up to 2500 A.

Embodiments of the technology disclosed herein employ distributed sensing and control through each level of a hierarchical power distribution system to implement a graduated approach to detecting and isolating electronics assembly components involved in an electrical fault. The approach can also be used for power supply trimming and voltage regulation at any selected level of the hierarchy.

In particular, in some embodiments, a fault processing subsystem of an electronics assembly first senses an alarm state at an output of a first power distribution element of a plurality of power distribution elements arranged in a hierarchy in the electronics assembly. The first element is at a level of the hierarchy other than the top level, and the alarm state corresponds to an output of the first element being different than an expected output of that element by at least the sum of a regulation margin of the first element, a noise margin of the first element, and a measurement accuracy of the fault processing subsystem. The fault processing subsystem first commands, in response to the first sensing, the first element to disable via a control input to the first element. In response to the fault processing subsystem second sensing an alarm state at the power output of the first commanded element, the fault processing subsystem commands an element at the next higher level in the hierarchy from the first element to disable.

By using and relying on the methods and systems described herein, network operators can employ networking devices of sufficient data capacity, mitigating the risk of equipment damage and personnel injury, and still provide networking services with less downtime by isolating electrical power faults at a low level in the power distribution hierarchy. These methods and systems can operate fast enough and at a lower fault current than other protection circuits and components to mitigate catastrophic conditions of smoke and fire. As such, the systems and methods described herein may be employed to improve the availability and reliability of electronics assemblies such as computer networking devices. Hence, additional users of such technology can benefit from better-performing computer networks.

Turning now to the drawings, in which like numerals represent like (but not necessarily identical) elements throughout the figures, example embodiments are described in detail.

Example Architectures

In example architectures for the technology, while certain devices shown in the architecture are represented by one instance of the device, multiple instances of each can be used. Further, while certain aspects of operation of the present technology are presented in examples related to the figures to facilitate enablement of the claimed invention, additional features of the present technology, also facilitating enablement of the claimed invention, are disclosed elsewhere herein.

Figure 1:
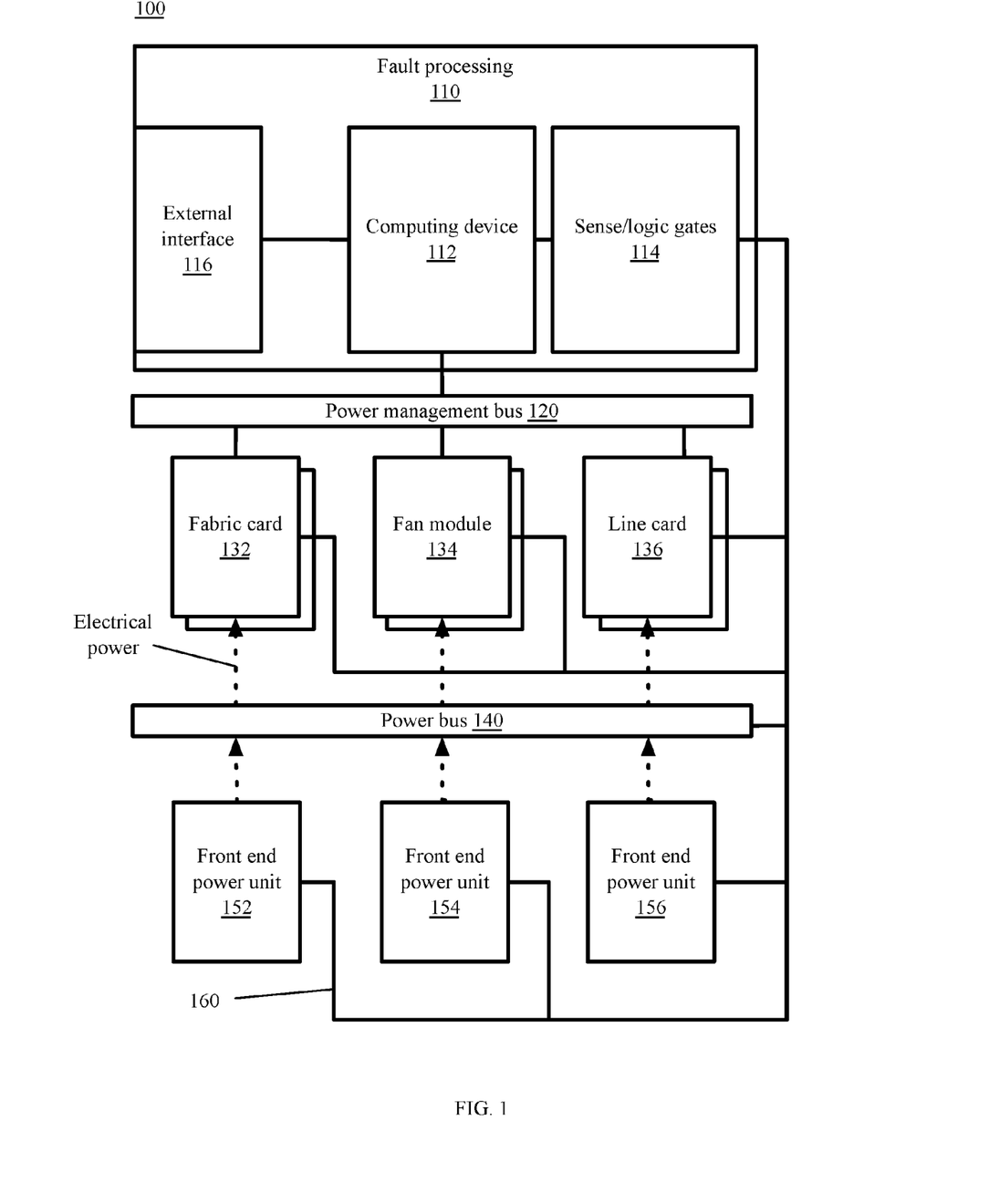
FIG. 1 is a block diagram depicting an architecture for electrical power control and fault protection in an electronics assembly, in accordance with certain example embodiments of the disclosed technology.

As depicted in FIG. 1, an example architecture 100 for electrical power control and fault protection in an electronics assembly, is shown. While the example architecture is based on a networking switch assembly, the principles of the disclosed technology apply to other similarly configured electronics assemblies. The architecture 100 includes: front end power (FEP) units 152, 154, and 156; at least one power bus 140; assembly modules such as switch fabric cards 132, fan modules 134, and line cards 136; a power management bus 120, a fault processing subsystem 110, and communications lines 160 for discrete sensors and interrupts. In some embodiments, the assembly, or an individual assembly component, includes one or more vapor sensors and one or more temperature sensors.

The FEP units 152, 154, and 156, also known as assembly-level power modules, can be alternating current (AC) supplied or direct current (DC) supplied modules. Example FEP units of either type (AC or DC) can typically output 51-57 VDC, and supply current up to and beyond 200 amps. In addition to a DC power output (for connecting to power bus 140), each FEP unit 152, 154, and 156 includes a power management bus 120 interface and an enable/disable control input that can accept normally open (NO) and normally closed (NC) inputs, for example, over communications lines 160. In some embodiments, each FEP unit 152, 154, and 156 includes a cooling fan, an input air temperature sensor, and an output air temperature sensor. In some embodiments, each FEP unit 152, 154, and 156 includes a vapor sensor operable to detect vapors typical of overheated electronics components.

The power bus 140 connects each FEP unit 152, 154, and 156 to assembly modules that perform the switch functions. In some embodiments, the power bus 140 can accommodate sensors—either sensors integrated into the power management bus 120, or discrete sensors connected directly to fault processing subsystem 110 via communications lines 160.

Assembly modules include switch fabric cards 132, fan modules 134 and line cards 136. Line cards 136, including modular services cards, forward processors, and label switch processors, provide interfaces to the networks on each side of the switch. A line card 136 provides an interface between the switch and one or more communications networks. For example, different line cards are used for connecting a switch to an Asynchronous Transfer Mode (ATM) network over a Synchronous Optical NETworking (SONET) backbone of the Public Switched Telephone Network (PSTN) than for connection the switch to a Gigibit Ethernet service. Each line card 136, including its physical interface module, implements Open Systems Interconnection (OSI) model Layer 1 (L1) through Layer 3 (L3) functionality that consists of physical layer framers and optics, Media Access Control (MAC) framing and access control, and packet lookup and forwarding capability. Line cards 136 segment ingress data packets into cells for switching by the switch fabric.

Switch fabric cards 132 implement the switch fabric by receiving data from ingress line cards 136 and performing the switching necessary to route data to the appropriate egress line cards 136. Each cell traverses the switch fabric using one of eight switch fabric planes through three stages: cell distribution, first level multicast, and second level multicast to an egress line card 136.

Fan modules 134 provide cooling for line cards 136 and switch fabric cards 132. In some embodiments, each fan module includes an input air temperature sensor and an output air temperature sensor. In some embodiments, each fan module 134 includes a vapor sensor operable to detect vapors typical of overheated electronics components.

The power management bus 120 is a relatively slow speed two conductor communications bus based on the Inter-Integrated Circuit (I2C) serial bus protocol. In some embodiments, the power management bus 120 is implemented as a Power Management Bus (PMBus) in which device attributes such as measured voltage and current levels, temperatures, and fan speeds can be controlled and monitored. Each line card 136, fabric card 132, fan module 134, and FEP unit 152, 154, and 156 is enabled to interface with the power management bus 120, and expose card/module attributes in multiple "pages." For example, one page may be used to manage each of several power outputs of a power supply. Warning and fault limits for each card/module can be set through the power management bus 120, where crossing a limit will alert the host (in this case the fault processing subsystem 110) and trigger fault recovery. While not explicitly shown in FIG. 1, the power management bus 120 also is connected to each FEP unit 152, 154, and 156.

The fault processing subsystem 110 include sensors/discrete logic gates 114, computing devices 112, and an optional external interface 116. A discrete logic gate is device implementing a Boolean function. It performs a logical operation on one or more logical inputs, and produces a single logical output. The inputs to the discrete logic gates can be the output of comparators formed from discrete electronics as part of the sensors/logic gates 114, or can be the output of sense pins of the active power distribution elements. Logic gates are primarily implemented using diodes or transistors acting as electronic switches. Logic gates can be cascaded in the same way that Boolean functions can be composed, allowing the construction of a physical model of all of Boolean logic. Simple processes, such as OR-ing two logic signals or creating a two-pulse serial communication, can be performed much faster using logic gates than using instruction-driven general purpose processors. The logic gates are connected to FEP units 152, 154, and 156, line cards 136, fan modules 134, fabric cards, and the power bus 140 by discrete sensing lines, and to each of the previous elements other than the power bus 140 (the "active power distribution elements") by at least one enable/disable line. While sense/logic gates 114 are shown in FIG. 1 as part of the fault processing subsystem 110 for ease of explanation, sense/logic gates 114 can be physically located near, or even onboard, the individual electronics assembly elements, as will be described in connection with FIG. 2.

Figure 7:
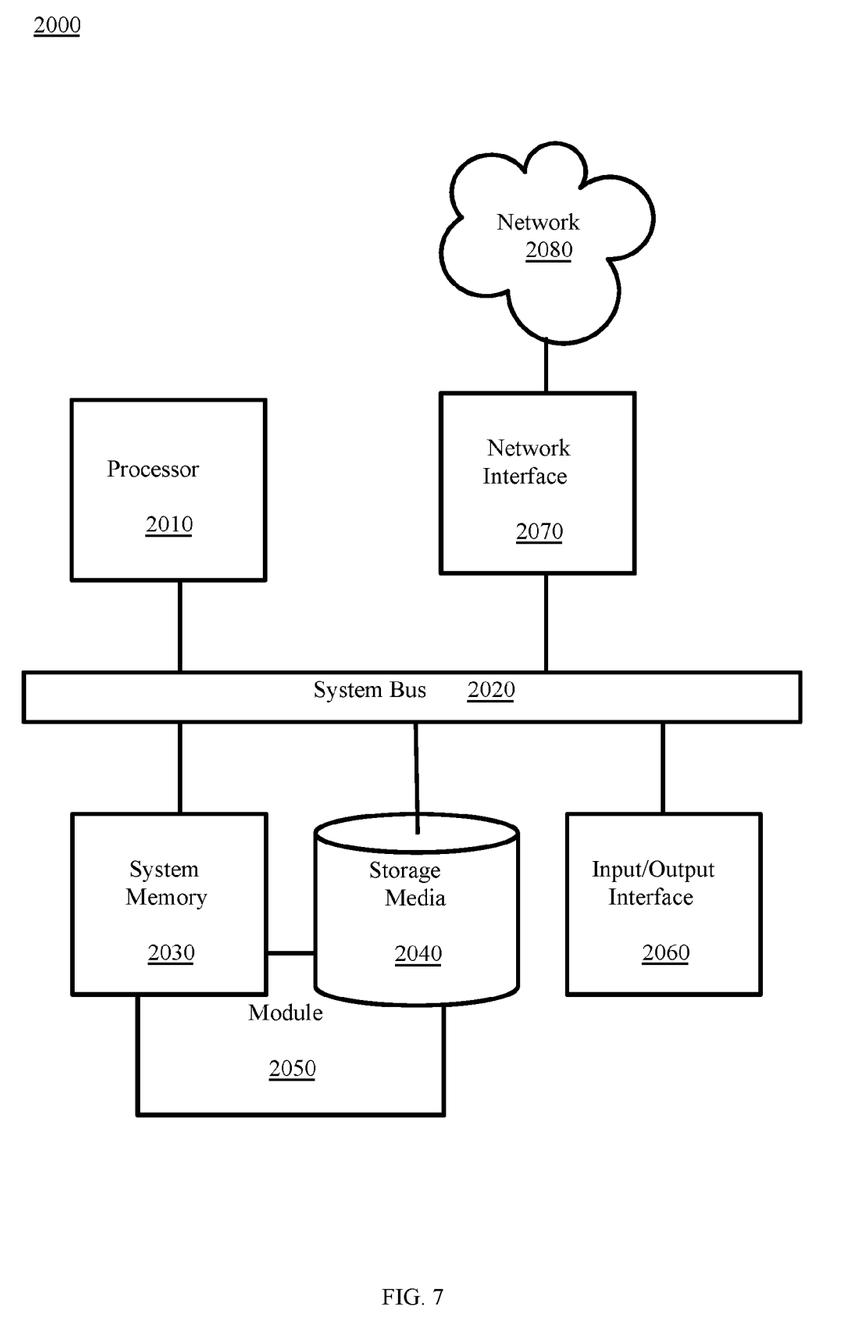
FIG. 7 is a block diagram depicting a computing machine and a module, in accordance with certain example embodiments.

Computing device 112 generally includes computing machines described in conjunction with FIG. 7. Specifically, in the example architecture, computing device 112 include at least one processor and memory in communication with the at least one processor, an interface to the power management bus 120, an interface to the sense/logic gates 114, and external interface 116. The memory stores processor-executable instructions that when executed by the processor(s) cause the one or more computing devices to perform certain functions described in conjunction with the example embodiments herein. The interface to sense/logic gates 114 receives alarm data from the logic gates. While computing device 112 is slower than sense/logic gates 114, more sophisticated functions, such as averaging values over time, determining population statistics for module characteristics collected over the power management bus 120, and interfacing with external devices via the external interface 116 are more readily implemented in computing device 112 than in sense/logic gates 114.

External interface 116 allows a user to connect an external computer to the logic devices 110 to interact with the computing device for control, programming, and data import/export. The external interface 116 can be one of a network interface card (NIC), a separate I2C interface, an RS series interface such as RS-232 or RS-422, or a universal serial bus (USB) interface, or any other interface typically used in conjunction with known computing devices 112. The logic devices 110 can be hosted in a card slot of the assembly along with fabric cards 132, line cards, and fan modules 134, or can be hosted in an enclosure away from the card slots.

Figure 2:
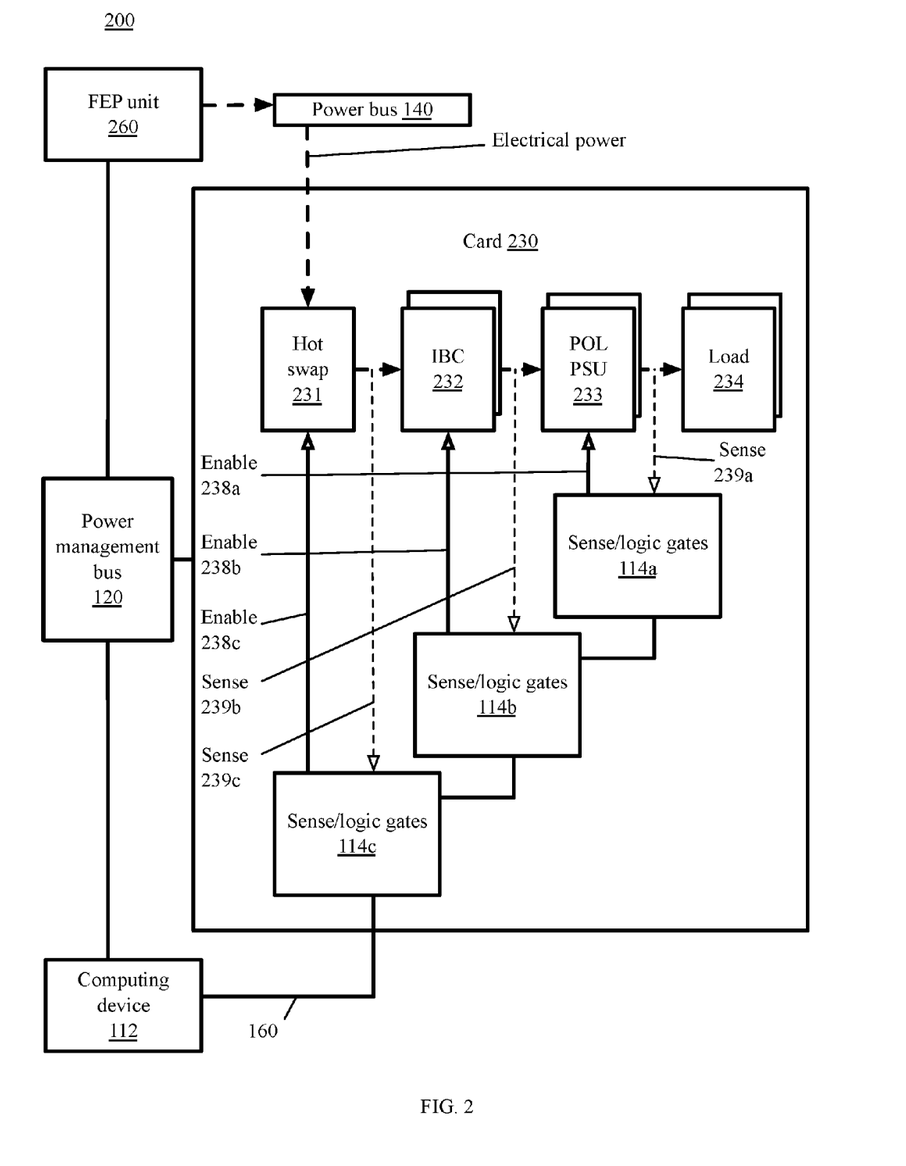
FIG. 2 is a block diagram depicting aspects of an architecture for electrical power control and fault protection at the card level of an electronics assembly, in accordance with certain example embodiments of the disclosed technology.

Referring to FIG. 2, and continuing to refer to FIG. 1 for context, an architecture 200 for electrical power control and fault protection at the card level of an electronics assembly is shown, in accordance with certain example embodiments. For example, card 230 can be a fabric card 132 or a line card 136 as shown in FIG. 1. Electrical power from one or more FEP units 260 is supplied to the card 230 via power bus 140. The collective FEP units 260 and power bus 140 form a top tier of a hierarchical power distribution system. The card 230 implements tiers below the top tier.

For example, each card includes a hot swap controller 231 as the highest tier of the active power distribution hierarchy on the card 230. A hot swap controller 231 can allow a card to be added to a live power bus 140, by controlling inrush current. When a card 230 is added to the power bus 140 the hot swap controller 231 ramps up power to the card 230 gradually to avoid power bus 140 glitches/transients and sparks. Hot swap controllers 231 typically include circuit breakers to protect downstream circuit elements from overcurrent situations. Hot swap controllers 231 typically do not perform voltage down conversion, leaving the voltage passed to the next level of the active power distribution hierarchy at the level of the power bus 140, for example 52 VDC.

The second level of the hierarchical distribution system on card 230 includes one or more intermediate bus converters (IBCs) 232. Each IBC 232 is supplied by the hot swap controller 231. A typical IBC provides fixed down-conversion of the voltage supplied from the hot swap controller 231 and isolation to downstream POL PSUs 233 and loads 234—typically down to 12 VDC or 9.6 VDC.

Each IBC supplies multiple point of load (POL) power supply units (PSUs) 233 at the next lower hierarchy level. POL PSUs 233 provide the final down conversion (if necessary) and voltage regulation, but not typically isolation, for loads 234 such as individual integrated circuits, microcontrollers, and Application Specific Integrated Circuits (ASICs), physically close to such loads 234. Each of the hot swap controller 231, IBCs 232, and POL PSUs 233 include power management bus 120 interfaces.

In FIG. 2, sense/logic gates 114 of the fault processing subsystem 110 are physically present on card 230. Placing the sense/logic gates 114 on the card 230 reduces signal propagation delay and reduces the opportunity for signal traces (such as sense and enable lines) to pick up or contribute to the system noise level. Each hot swap controller 231, IBC 232, and POL PSU 233 is associated with a sense/logic gate subassembly, for example, hot swap controller 231 is associated with sense/logic gates 114*c* via enable line 238*c* and sense line 239*c*. Each sense line senses the output of the associated active power distribution element for the sense/logic gates 114, and each enable line is operative to communicate an enable or disable signal from the sense logic/gates 114 to the respective active power distribution element based on the arrangement of the specific sense/logic in the subassembly. Each sense/logic gates subassembly includes discrete electronics components to convert a sensed property, for example, voltage, at the output of a power distribution hierarchy element, compare the sense property to an alarm level, and upon determination that the sensed property exceeds the alarm level, command the power distribution hierarchy element to disable using the enable line between the sense/logic gates subassembly and the active power distribution element. IBC 232 is associated with sense/logic gates 114*b* via enable line 238*b* and sense line 239*b*. POL PSU 233 is associated with sense/logic gates 144*a* via enable line 238*a* and sense line 239*a*.

Figure 3:
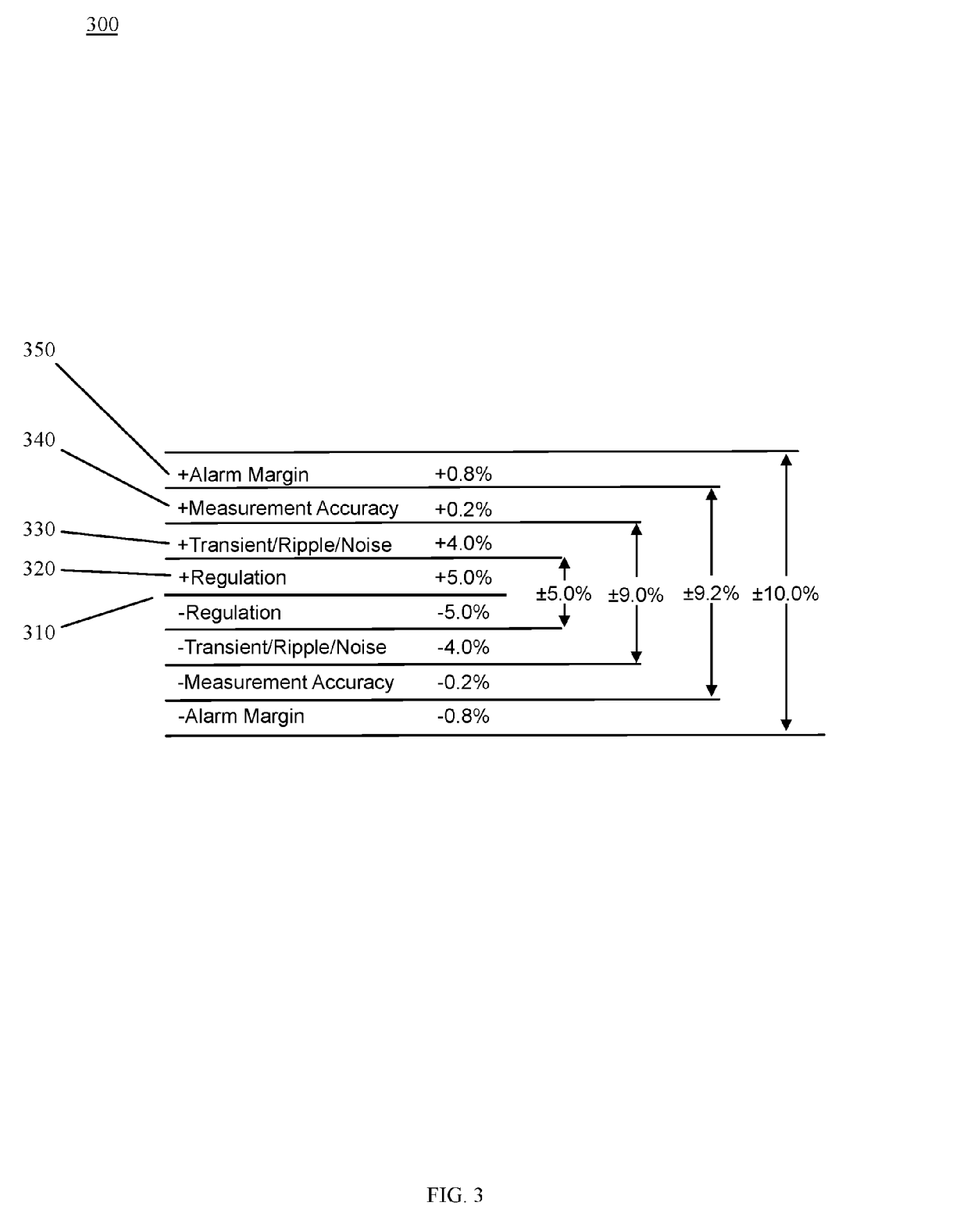
FIG. 3 is a diagram depicting voltage ranges related to power control and fault protection, in accordance with certain example embodiments.

Referring to FIG. 3, and continuing to refer to prior figures for context, an example alarm level 300, with an alarm margin 350 of 10% above and below a nominal expected value 310 for a voltage output of a POL PSU 233 is shown. In the example of FIG. 3, the alarm margin 350 is based on the cumulative margins for regulation 320 of the POL PSU 233 (typically specified by the POL PSU manufacturer), voltage transients/ripple/noise in the output power of the POL PSU 233 (again, typically specified by the POL PSU manufacturer), and the measurement accuracy of the sense/logic gates 114*a* connected to the POL PSU 233. The size of the alarm margin 350 can be determined empirically during the design phase for the card 230 to reduce the frequency of false positive shutdowns of the active power distribution hierarchy element associated with the sense/logic gates subassembly 114*a*, yet still provide for disabling the active power distribution hierarchy element associated with the sense/logic gates subassembly 114*a* before damage can be done to the active power distribution hierarchy element or the load 234 receiving power from the element.

Returning to FIG. 2, each sense/logic gate subassembly 114*a*, 114*b*, 114*c*, continues to sense the output of its associated active power distribution element after detecting an alarm and commanding the associated active power distribution element to disable. If the alarm condition remains, the sense/logic gates 114 command the active power distribution element in the next higher level of the hierarchy to disable. For example, if after commanding the POL PSU 233 to disable, based on an alarm condition sensed by sense/logic gates 114*a* via sense line 239*b* at the output of POL PSU 233, an alarm condition is still sensed by sense/logic gates 114*a*, then sense/logic gates 114*a* communicates to sense logic gates 114*b* to disable IBC 232 via enable line 238*b*. In the example architecture of FIG. 2, this process is implemented in discrete electronics and discrete logic gates, including delay components, of sense/logic gates 114*a* and sense logic gates 114*b*.

Implementing the above process in hardware in this manner, without the use of software, has the advantage of quick response times, thus allowing the technology to prevent continued damage to the card 230 due to faults such as overcurrent and shorts to ground—each of which would drive the output voltage of the POL PSU 233 below the lower alarm limit. Conversely, a defective POL PSU 233 could output a voltage outside the upper alarm limit that would trigger the sense/logic gates 114*a* to command the POL PSU 233 to disable. If that command is ineffective at disabling the defective POL PSU 233, then sense/logic gates 114*a*, through sense logic gates 114*b*. would command IBC 232, the next higher element in the active power distribution hierarchy, to disable via enable line 238*b*—thus depriving POL PSU 233 (and it peer elements at that level of the hierarchy) of power, and protecting load 234 (and the loads of peer POL PSU elements) from further damage. In some embodiments, a complete shutdown of the active power distribution element is not required, and the sense/logic gates 114 can command a brief interruption to the active power distribution element, for exampling a toggling or re-starting of the active power distribution element. If the alarm state persists after commanding the IBC 232 to disable, the process can be repeated at the level of the hot swap controller 231.

The above process is useful for responding to instantaneous or short duration faults, for example, faults on the order of microseconds. However, some faults do not trigger the alarm conditions described above, but nonetheless pose a risk to the electronics assembly. Some such faults can develop over time, for example over milliseconds, second, minutes, or even longer, and require a more flexible analysis and response. For example, operation of an active power distribution element outside its specified range for transients, noise, or jitter, while not sufficient to create an alarm condition, can be damaging to components over time and degrade system performance. For such conditions, the present technology employs computing device 112 and the power management bus 120 to respond.

Continuing to refer to FIG. 2, computing device 112 of fault processing subsystem 110 can establish a profile of a non-alarm state of the output of each active power distribution element in the power distribution hierarchy. Each profile can be established by storing expected performance parameters specified by the manufacturer of the active power distribution element. For example, while FIG. 3 indicates that the regulation range of the POL PSU 233 output voltage is 5%, the nominal output voltage of the POL PSU 233 should not exceed 4% for more than 50% of the duty cycle of the POL PSU 233 over the course of a minute. Consider that while variation of the output voltage within the regulation limit of the active power distribution element is to be expected, a POL PSU 233 that outputs a voltage near the limit of the regulation band for a high percentage of the time, despite repeated trimming to the nominal level, can be considered a POL PSU 233 at risk of failure. Such behavior will not trigger an alarm from the sense/logic gates 114, but may still merit shutting down or restarting the POL PSU 233, or at least recording the behavior to facilitate long term control.

Computing device 112 can sense the output voltage of the POL PSU 233 via the power management bus 120, and determine if the POL PSU 233 output voltage is outside the profile for voltage regulation (even though the instantaneous value of the output does not exceed the regulation limit of 5%). Upon determining that the POL PSU 233 is operating outside the profile, the computing device can command the POL PSU 233, via the power management bus 120 to restart, to re-regulate, or to disable. Computing device 112 can then continue to sense the output voltage of the POL PSU 233 via the power management bus 120, and if the output voltage of the POL PSU 233 remains outside the profile for voltage regulation, the computing device can command the next higher active power distribution element in the hierarchy, in this example IBC 232, to restart, re-regulate, or disable via the power management bus 120.

By using and relying on the methods, logic, and systems described herein, network operators can employ networking devices of sufficient capacity, mitigating the risk of equipment damage and personnel injury, and still provide networking services with less downtime by isolating electrical power faults at a low level in the power distribution hierarchy. As such, the systems and methods described herein may be employed to improve the availability and reliability of electronics assemblies such as computer networking devices. Hence, additional users of such technology can benefit from better-performing, more reliable, and safer computer networks.

Example Processes

Figure 4:
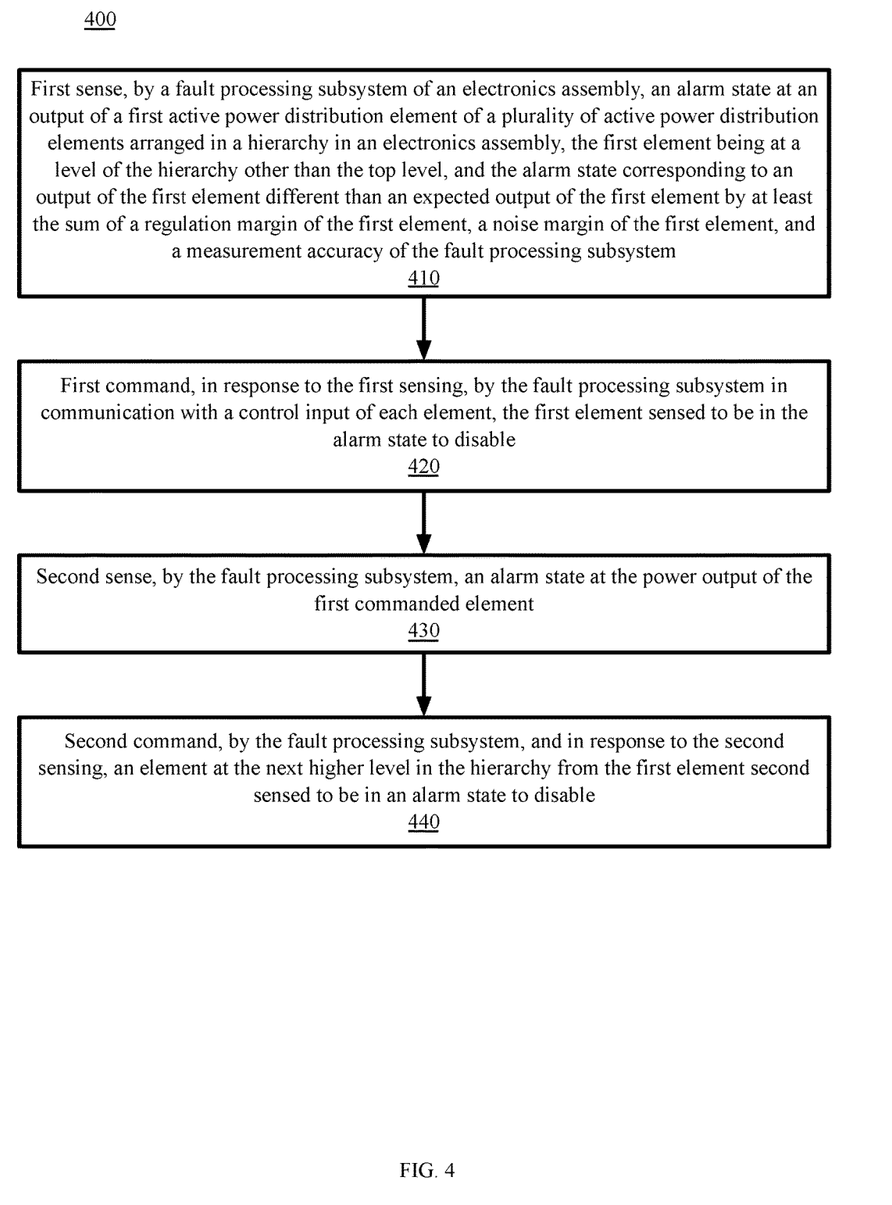
FIG. 4 is a block flow diagram depicting methods to control electrical power and to protect electronics systems from electrical faults, in accordance with certain example embodiments.

Referring to FIG. 4, and continuing to refer prior figures for context, a block flow diagram illustrating methods 400 to control electrical power and protect electronics systems from electrical faults is shown, in accordance with certain example embodiments. In such embodiments, a fault processing subsystem 110 of an electronics assembly first senses an alarm state at an output of a first power distribution element, for example power distribution element POL PSU 233—Block 410. The first power distribution element 233 is one of a plurality of power distribution elements arranged in a hierarchy in an electronics assembly. The alarm state corresponds to an output of the first element 233 that is different than an expected output of the first element by at least the sum of: a) a regulation margin of the first element 233, b) a noise margin of the first element 233, and c) a measurement accuracy of the fault processing subsystem 110.

In a continuing example, a line card 230 of a computer network switch includes a point of load (POL) power supply unit (PSU) 233. The POL PSU 233 is a power distribution element at the lowest level of a hierarchy of power distribution elements on the line card 230. The POL PSU 233 is a non-isolated POL supply that accepts a 12 VDC supply from intermediate bus converter (IBC) 232 and supplies a nominal 1.2 VDC to load 234. The IBC 232 supplies at least one other POL PSU and at least one direct load. In turn, the IBC is supplied from a hot swap controller 231 that provides start-up protection to several IBCs on card 230. The hot swap controller 231 is supplied from the power bus 140 at 54 VDC by multiple front end power units (FEPs) connected to the power bus 140 in parallel.

In the continuing example, sense/logic gates 114a of the fault processing subsystem 110 of the electronics assembly senses, via sense line 239a that the voltage output of the POL PSU 233 is 11% below the nominal 3.3 VDC. This amount of difference is beyond the alarm margin 350 which extends+/−10% around the nominal voltage of the POL PSU 233 to include the regulation margin of the POL PSU 233 (+/−5.0%), the noise margin of the POL PSU 233 (+/−4.0%), and the measurement accuracy of the fault processing subsystem 110.

In response to the first sensing, fault processing subsystem 110 first commands the first element sensed to be in the alarm state to disable—Block 420. In the continuing example, sense/logic gates 114a of fault processing subsystem 110 are in communication with a control input first element 233 through an enable line 238a. Sense/logic gates 114a of fault processing subsystem 110 command first element 233 through an enable line 238a to disable. POL PSU 233 has failed, and cannot disable its output, which continues to be pulled low by load 234.

The fault processing subsystem 110 second senses an alarm state at the power output of the first commanded element—Block 430. Given that POL PSU 233 has failed, and cannot disable its output, the alarm state (POL PSU 233 output voltage 11% below nominal) continues. This situation could be the result of various factors. For example, load 234 could be leaking current to ground or may have lost its heat sink, or POL PSU may simply be defective. Regardless of the cause, sense/logic gates 114a continue to sense a voltage via sense line 239a that corresponds to an 11% voltage drop from nominal for the output of POL PSU 233.

In response to the second sensing, the fault processing subsystem 110 second commands an element at the next higher level in the hierarchy from the first element to disable—Block 440. In the continuing example, sense/logic gates 114 communicate the continued alarm state to sense/logic gates 114b. Sense/logic gates 114b command IBC 232, the power distribution element at the next level in the hierarchy, to disable via enable line 238b. In the continuing example, this command successfully isolates the fault in the branches of the hierarchy served by IBC 232. Using sense/ logic gates, instead of firmware or software, allows method 400 to complete on the order of one to tens of microseconds. Card 230 can then perform functional reporting per its system operating software outside of the present technology. By way of illustration, line card 230 can use the chassis backplane (not shown) to report partial or complete shutdown of the line card 230 to a system controller (not shown).

In some embodiments of the present technology, the fault processing subsystem 110 commands the first element to reset, instead of to disable, with the first command. In some embodiments, the fault processing subsystem commands the first element to enable after a predetermined period of disablement, and begins sensing again for an alarm state. In some embodiments, the fault processing subsystem commands the element at the next level of the hierarchy from the first element to reset, instead of to disable, on the second command.

In some embodiments of the present technology, the fault processing subsystem 110 includes at least one temperature sensor. In such embodiments, sensing, as described in connection with FIG. 4, includes sensing a temperature by the sensor, and the alarm state includes a sensed temperature being outside an expected temperature range. For example, the temperature sensor can be placed adjacent, or on, a heat sink of an IBC 232 in card 230. Sense/logic gates 114b can monitor for an alarm state corresponding to a flash point temperature of the IBC 233 casing, and engage the first commanding, second sensing, and (if necessary) second commanding of the hot swap controller 231 should the alarm persist after the first command. In some embodiments of the present technology, the fault processing subsystem 110 includes a vapor sensor. Vapor sensors can detect vapors given off by overheating (or even combusting) devices, including insulators. In such embodiments, sensing includes sensing a vapor by the at least one vapor sensor, and the alarm state includes a sensed vapor above a predetermined concentration of the vapor.

Figure 5A:
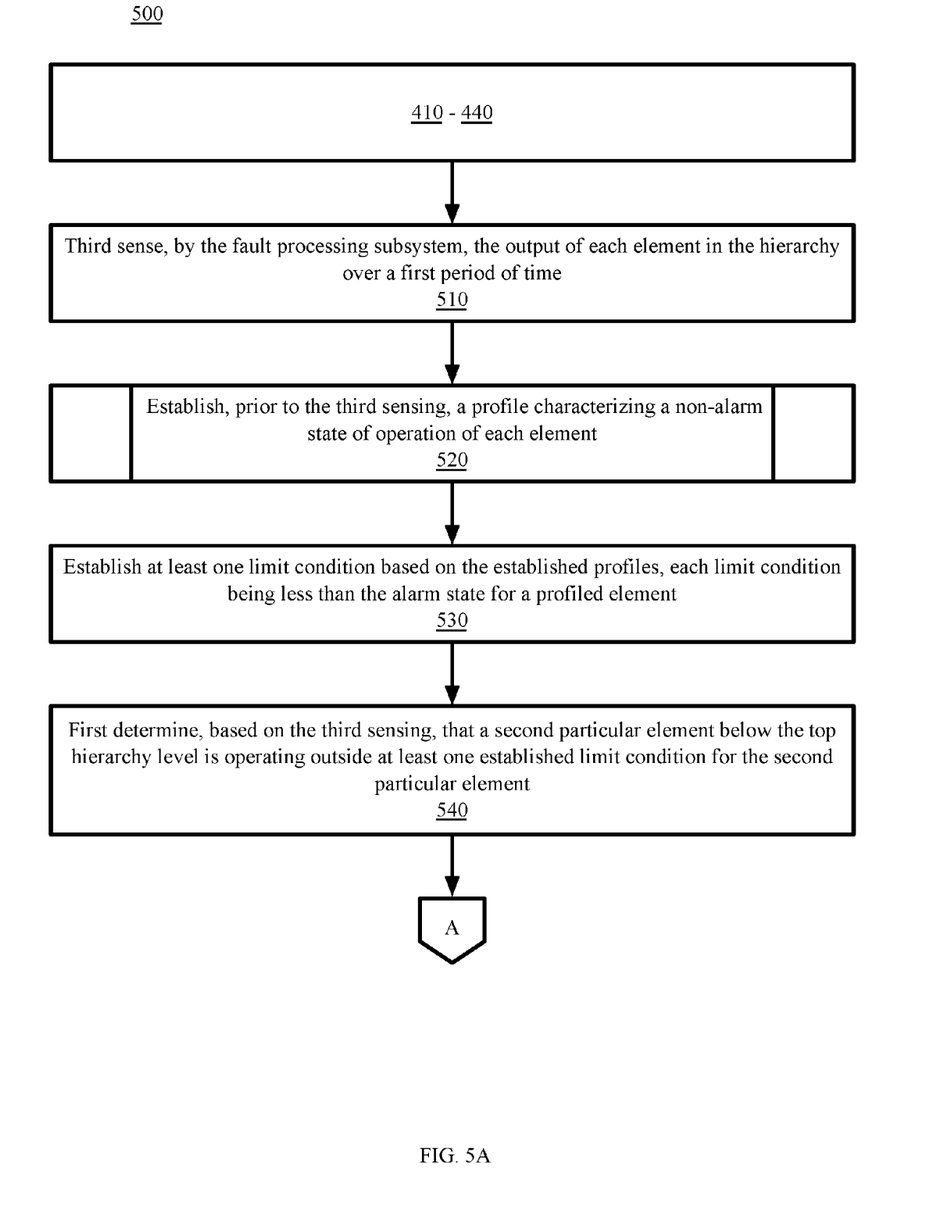
FIGS. 5A and 5B, is a block flow diagram depicting methods to control electrical power and to protect electronics systems from electrical faults, in accordance with certain example embodiments.
Figure 5B:
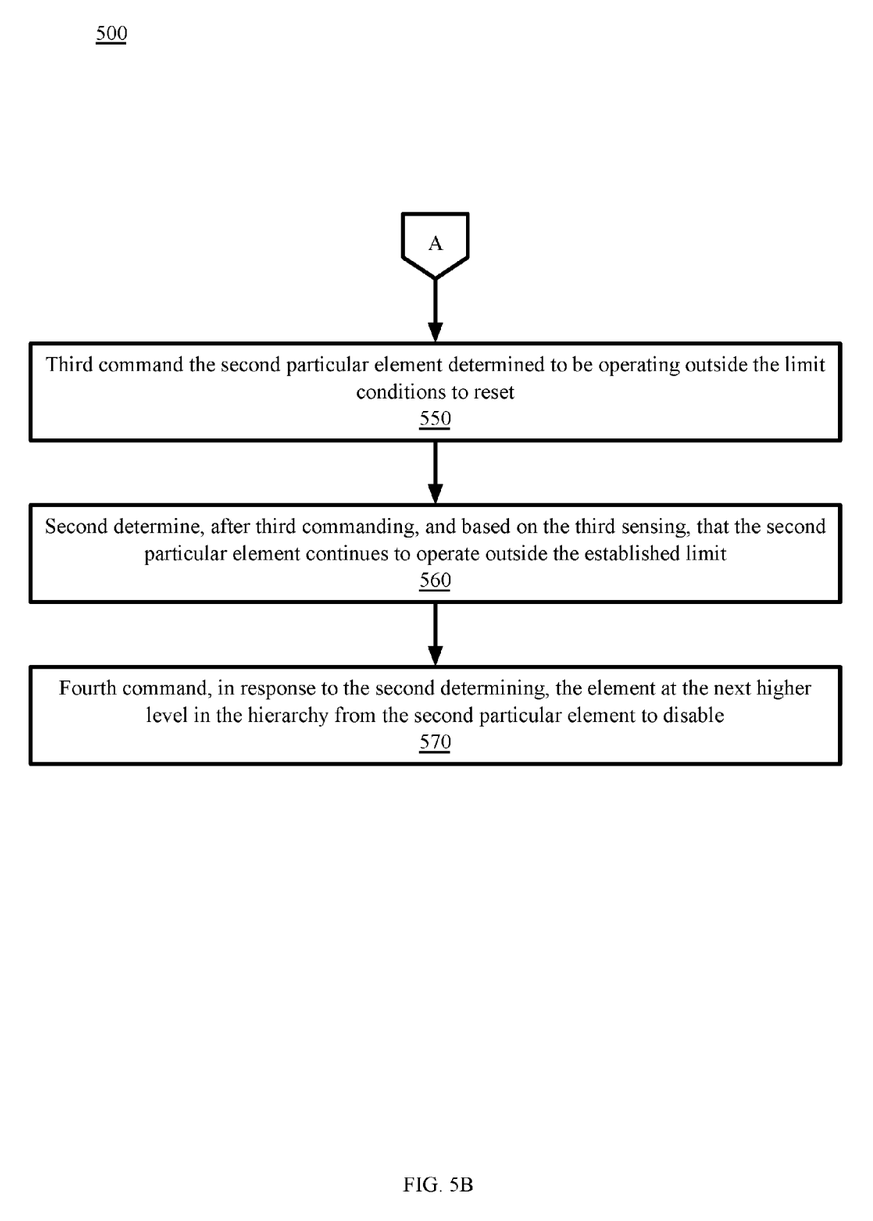

Referring to FIG. 5, and continuing to refer to prior figures for context, a block flow diagram illustrating methods 500 to control electrical power and protect electronics systems from electrical faults is shown, in accordance with certain example embodiments. In such embodiments, blocks 410-440 are performed as described above. In such embodiments, the technology can gather data over time, and respond to trends and conditions short of alarm states. The fault processing subsystem 110 can third sense the output of each element of the hierarchy of power distribution elements over a first period of time—Block 510. Such sensing can be through the sense/logic gates 114 of the fault processing subsystem 110, for example by sampling each sense line 239a, 239b, and 239c. Such sensing can also be through the features of the PMBus 120.

In the methods of FIG. 5, the fault processing subsystem 110 can include one or more computing devices, such as computing machines described in connection with FIG. 7. In the methods of FIG. 5, the one or more computing devices includes comprises at least one processor 2010 and memory, such as memory 2030 and 2040, in communication with the at least one processor 2010. Memory, such as storage media 2040, stores processor-executable instructions, such as module 2050, that when executed by the at least one processor 2010 cause the one or more computing devices to perform the functions depicted in FIG. 5.

Specifically, computing device 112, prior to the third sensing, can establish a profile characterizing a non-alarm state of operation of each element in the hierarchy of power distribution elements—Block 520. In the continuing example, each profile is established by storing expected performance parameters specified by the manufacturer for each power distribution element on card 230. For example, while FIG. 3 indicates that the regulation range of the POL PSU 233 output voltage is 5%, the nominal output voltage of the POL PSU 233 should not exceed 4% for more than 50% of the duty cycle of the POL PSU 233 over the course of a minute. Consider that while variation of the output voltage within the regulation limit of the active power distribution element is to be expected, a POL PSU 233 that outputs a voltage near the limit of the regulation band for a high percentage of the time, despite repeated trimming to the nominal level, can be considered a POL PSU 233 at risk of failure. Such behavior will not trigger an alarm from the sense/logic gates 114 under methods described in conjunction with FIG. 4, but may still merit action.

Figure 6:
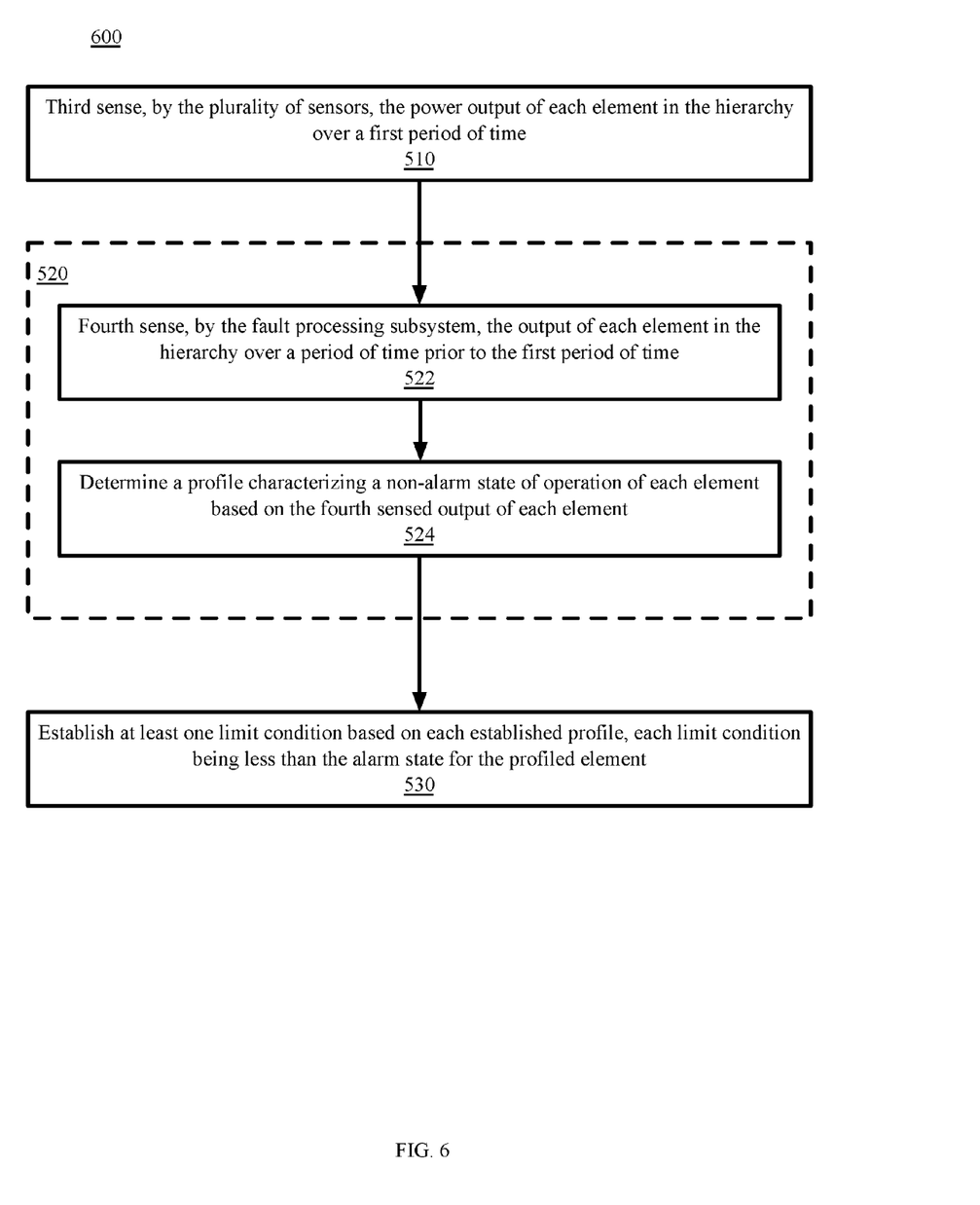
FIG. 6 is a block flow diagram depicting methods to control electrical power and to protect electronics systems from electrical faults, in accordance with certain example embodiments.

As a further example, consider FIG. 6, in which methods 600 of establishing a profile characterizing a non-alarm state of operation of each element in the hierarchy of power distribution elements is shown, in accordance with example embodiments. In such methods the computing device 112 of fault processing subsystem 110 fourth senses the output of each element in the hierarchy over a period of time prior to the first period of time—Block 522. In the further example, computing device 112 of fault processing subsystem 110 samples the output voltage of each of hot swap controller 231, each IBC 232, and each POL PSU 233 once per second over a randomly selected one minute periods of non-alarmed normal operation prior to the first period of time over the PMBus 120.

Computing device 112 of fault processing subsystem 100 then determines a profile characterizing the non-alarmed state of operation of each element based on the fourth sensing—Block 524. In the further example, computing device 112 of fault processing subsystem 110 determines an output voltage profile for POL PSU 233 that characterizes POL PSU 233 as varying more than 4% from its nominal value for more less than 50% of its sampled duty cycle, but also that the average voltage variation for POL PSU 233 is 2% around its nominal value. In the further example, the first part of the empirically determined profile for POL PSU 233 matches its manufacturer-specified profile. The specific output characteristics to be sensed and the specific parameters to be determined can be programmed into the computing device on manufacture, or in some embodiments, can be controlled via the external interface 116 of the fault processing subsystem 110.

Returning to FIG. 5, the computing device 112 of the fault processing subsystem 110 establishes at least one limit condition based on the established profiles, with each limit condition being less than the alarm state for the profiled power distribution element—Block 530. In the continuing example, two limit conditions are established for POL PSU 233—the original limit condition of less than or equal to 4% variation in the nominal output voltage for less than 50% of any sampled duty cycle, and the empirically-determined limit condition of less than or equal to 2% average variation across an entire sampled duty cycle.

The computing device 112 of the fault processing subsystem 110 determines, based on the third sensing, that a second particular power distribution element below the top level of the hierarchy is operating outside at least one established limit condition for the second particular element—Block 540. In the continuing example, the computing device 112 determines from the third sensing, via PMBus 120, that the POL PSU 233, while operating within the 4% variation in the nominal output voltage for less than 50% of the sampled duty cycles, it operating at an average variation of 2.3% across the entire sampled duty cycle—outside one of the limit conditions established for the POL PSU 233.

The computing device 112 of the fault processing subsystem 110 third commands, via PMBus 120, the second particular element of the power distribution hierarchy operating outside a limit condition established for the second particular element to reset—Block 550. In the continuing example, given that the limit conditions are less than the conditions of an alarm state, a measure less drastic than disabling the POL PSU 233 is used, and the computing device 112 of the fault processing subsystem 110 commands the POL PSU 233 via the power management bus to reset and continue operation.

The computing device 112 of the fault processing system 110 second determines, based on the third sensing, that the second particular power distribution element continues to operate outside the limit established for the second particular power distribution element—Block 560. In some embodiments, the second determination that the second particular element continues to operate outside the established limit can be subject to a predetermined expiration timer. For example, if the second particular element is not determined as continuing to operate outside the established limit for one minute after the command to reset, a subsequent determination that the second particular element operating outside the established limit can be treated as an initial determination of operation outside the established limit.

In the continuing example, the computing device 112 of the fault processing system 110 determines that the POL PSU 233 continues to operate at an average variation of 2.3% across the entire sampled duty cycle (outside one of the limit conditions established for the POL PSU 233) based on third sensing done via the power management bus 120.

In response to the second determining, the computing device 112 fourth commands the power distribution element at the next higher level of the hierarchy from the second particular element to disable—Block 570. In the continuing example, the computing device 112 of the fault processing system 110 commands the IBC 232 at the next level to disable via the power management bus 120.

In some embodiments of the technology, instead of disabling the element at the next higher level on the fourth command, the technology can reset the element at the next higher level. In some embodiments, instead of acting on the element at the next higher level after a reset of the second particular element fails, the technology can disable the second particular element.

In some embodiments of the technology, the fault processing subsystem 110 profiles a group of active power distribution devices. For example, POL PSUs serving non-critical loads can be profiled to disable based on limit conditions of other power distribution devices. For example, if the fault processing subsystem 110 determines that the FEP units 260 supplying the power bus are operating outside a limit condition, such as at a higher than desirable temperature, the fault processing subsystem 110 can disable POL PSUs serving non-critical loads to reduce the burden on the FEP units 260.

Other Example Embodiments

FIG. 7 depicts a computing machine 2000 and a module 2050 in accordance with certain example embodiments. The computing machine 2000 may correspond to any of the various computers, servers, mobile devices, embedded systems, or computing systems presented herein. The module 2050 may comprise one or more hardware or software elements configured to facilitate the computing machine 2000 in performing the various methods and processing functions presented herein. The computing machine 2000 may include various internal or attached components, for example, a processor 2010, system bus 2020, system memory 2030, storage media 2040, input/output interface 2060, and a network interface 2070 for communicating with a network 2080.

The computing machine 2000 may be implemented as a conventional computer system, an embedded controller, a laptop, a server, a mobile device, a smartphone, a set-top box, a kiosk, a vehicular information system, one more processors associated with a television, a customized machine, any other hardware platform, or any combination or multiplicity thereof. The computing machine 2000 may be a distributed system configured to function using multiple computing machines interconnected via a data network or bus system.

The processor 2010 may be configured to execute code or instructions to perform the operations and functionality described herein, manage request flow and address mappings, and to perform calculations and generate commands. The processor 2010 may be configured to monitor and control the operation of the components in the computing machine 2000. The processor 2010 may be a general purpose processor, a processor core, a multiprocessor, a reconfigurable processor, a microcontroller, a digital signal processor (DSP), an application specific integrated circuit (ASIC), a graphics processing unit (GPU), a field programmable gate array (FPGA), a programmable logic device (PLD), a controller, a state machine, gated logic, discrete hardware components, any other processing unit, or any combination or multiplicity thereof. The processor 2010 may be a single processing unit, multiple processing units, a single processing core, multiple processing cores, special purpose processing cores, co-processors, or any combination thereof. According to certain embodiments, the processor 2010 along with other components of the computing machine 2000 may be a virtualized computing machine executing within one or more other computing machines.

The system memory 2030 may include non-volatile memories, for example, read-only memory (ROM), programmable read-only memory (PROM), erasable programmable read-only memory (EPROM), flash memory, or any other device capable of storing program instructions or data with or without applied power. The system memory 2030 may also include volatile memories, for example, random access memory (RAM), static random access memory (SRAM), dynamic random access memory (DRAM), and synchronous dynamic random access memory (SDRAM). Other types of RAM also may be used to implement the system memory 2030. The system memory 2030 may be implemented using a single memory module or multiple memory modules. While the system memory 2030 is depicted as being part of the computing machine 2000, one skilled in the art will recognize that the system memory 2030 may be separate from the computing machine 2000 without departing from the scope of the subject technology. It should also be appreciated that the system memory 2030 may include, or operate in conjunction with, a non-volatile storage device, for example, the storage media 2040.

The storage media 2040 may include a hard disk, a floppy disk, a compact disc read only memory (CD-ROM), a digital versatile disc (DVD), a Blu-ray disc, a magnetic tape, a flash memory, other non-volatile memory device, a solid state drive (SSD), any magnetic storage device, any optical storage device, any electrical storage device, any semiconductor storage device, any physical-based storage device, any other data storage device, or any combination or multiplicity thereof. The storage media 2040 may store one or more operating systems, application programs and program modules, for example, module 2050, data, or any other information. The storage media 2040 may be part of, or connected to, the computing machine 2000. The storage media 2040 may also be part of one or more other computing machines that are in communication with the computing machine 2000, for example, servers, database servers, cloud storage, network attached storage, and so forth.

The module 2050 may comprise one or more hardware or software elements configured to facilitate the computing machine 2000 with performing the various methods and processing functions presented herein. The module 2050 may include one or more sequences of instructions stored as software or firmware in association with the system memory 2030, the storage media 2040, or both. The storage media 2040 may therefore represent examples of machine or computer readable media on which instructions or code may be stored for execution by the processor 2010. Machine or computer readable media may generally refer to any medium or media used to provide instructions to the processor 2010. Such machine or computer readable media associated with the module 2050 may comprise a computer software product. It should be appreciated that a computer software product comprising the module 2050 may also be associated with one or more processes or methods for delivering the module 2050 to the computing machine 2000 via the network 2080, any signal-bearing medium, or any other communication or delivery technology. The module 2050 may also comprise hardware circuits or information for configuring hardware circuits, for example, microcode or configuration information for an FPGA or other PLD.

The input/output (I/O) interface 2060 may be configured to couple to one or more external devices, to receive data from the one or more external devices, and to send data to the one or more external devices. Such external devices along with the various internal devices may also be known as peripheral devices. The I/O interface 2060 may include both electrical and physical connections for operably coupling the various peripheral devices to the computing machine 2000 or the processor 2010. The I/O interface 2060 may be configured to communicate data, addresses, and control signals between the peripheral devices, the computing machine 2000, or the processor 2010. The I/O interface 2060 may be configured to implement any standard interface, for example, small computer system interface (SCSI), serial-attached SCSI (SAS), fiber channel, peripheral component interconnect (PCI), PCI express (PCIe), serial bus, parallel bus, advanced technology attached (ATA), serial ATA (SATA), universal serial bus (USB), Thunderbolt, FireWire, various video buses, and the like. The I/O interface 2060 may be configured to implement only one interface or bus technology. Alternatively, the I/O interface 2060 may be configured to implement multiple interfaces or bus technologies. The I/O interface 2060 may be configured as part of, all of, or to operate in conjunction with, the system bus 2020. The I/O interface 2060 may include one or more buffers for buffering transmissions between one or more external devices, internal devices, the computing machine 2000, or the processor 2010.

The I/O interface 2060 may couple the computing machine 2000 to various input devices including mice, touch-screens, scanners, electronic digitizers, sensors, receivers, touchpads, trackballs, cameras, microphones, keyboards, any other pointing devices, or any combinations thereof. The I/O interface 2060 may couple the computing machine 2000 to various output devices including video displays, speakers, printers, projectors, tactile feedback devices, automation control, robotic components, actuators, motors, fans, solenoids, valves, pumps, transmitters, signal emitters, lights, and so forth.

The computing machine 2000 may operate in a networked environment using logical connections through the network interface 2070 to one or more other systems or computing machines across the network 2080. The network 2080 may include wide area networks (WAN), local area networks (LAN), intranets, the Internet, wireless access networks, wired networks, mobile networks, telephone networks, optical networks, or combinations thereof. The network 2080 may be packet switched, circuit switched, of any topology, and may use any communication protocol. Communication links within the network 2080 may involve various digital or analog communication media, for example, fiber optic cables, free-space optics, waveguides, electrical conductors, wireless links, antennas, radio-frequency communications, and so forth.

The processor 2010 may be connected to the other elements of the computing machine 2000 or the various peripherals discussed herein through the system bus 2020. It should be appreciated that the system bus 2020 may be within the processor 2010, outside the processor 2010, or both. According to certain example embodiments, any of the processor 2010, the other elements of the computing machine 2000, or the various peripherals discussed herein may be integrated into a single device, for example, a system on chip (SOC), system on package (SOP), or ASIC device.

Embodiments may comprise a computer program that embodies the functions described and illustrated herein, wherein the computer program is implemented in a computer system that comprises instructions stored in a machine-readable medium and a processor that executes the instructions. However, it should be apparent that there could be many different ways of implementing embodiments in computer programming, and the embodiments should not be construed as limited to any one set of computer program instructions. Further, a skilled programmer would be able to write such a computer program to implement an embodiment of the disclosed embodiments based on the appended block flow diagrams and associated description in the application text. Therefore, disclosure of a particular set of program code instructions is not considered necessary for an adequate understanding of how to make and use embodiments. Further, those skilled in the art will appreciate that one or more aspects of embodiments described herein may be performed by hardware, software, or a combination thereof, as may be embodied in one or more computing systems. Moreover, any reference to an act being performed by a computer should not be construed as being performed by a single computer as more than one computer may perform the act.

The example embodiments described herein can be used with computer hardware and software that perform the methods and processing functions described previously. The systems, methods, and procedures described herein can be embodied in a programmable computer, computer-executable software, or digital circuitry. The software can be stored on computer-readable media. For example, computer-readable media can include a floppy disk, RAM, ROM, hard disk, removable media, flash memory, memory stick, optical media, magneto-optical media, CD-ROM, etc. Digital circuitry can include integrated circuits, gate arrays, building block logic, field programmable gate arrays (FPGA), etc.

The example systems, methods, and acts described in the embodiments presented previously are illustrative, and, in alternative embodiments, certain acts can be performed in a different order, in parallel with one another, omitted entirely, and/or combined between different example embodiments, and/or certain additional acts can be performed, without departing from the scope and spirit of various embodiments. Accordingly, such alternative embodiments are included in the scope of the following claims, which are to be accorded the broadest interpretation so as to encompass such alternate embodiments.

Although specific embodiments have been described above in detail, the description is merely for purposes of illustration. It should be appreciated, therefore, that many aspects described above are not intended as required or essential elements unless explicitly stated otherwise. Modifications of, and equivalent components or acts corresponding to, the disclosed aspects of the example embodiments, in addition to those described above, can be made by a person of ordinary skill in the art, having the benefit of the present disclosure, without departing from the spirit and scope of embodiments defined in the following claims, the scope of which is to be accorded the broadest interpretation so as to encompass such modifications and equivalent structures.

We claim:

1. A method, comprising:

sensing, by a fault processing subsystem of an electronics assembly, a first alarm state at an output of a first active power distribution element of a plurality of active power distribution elements arranged in a hierarchy in the electronics assembly, the first element being at a level of the hierarchy other than the top level, and the first alarm state corresponding to a value at the output of the first element being different than an expected value at the output of the first element by at least a sum of a regulation margin of the first element, a noise margin of the first element, and a measurement accuracy of the fault processing system;

in response to sensing the first alarm state at the output of the first element, commanding, by the fault processing subsystem in communication with a control input of each element, the first element to disable;

sensing, by the fault processing subsystem, a subsequent alarm state at the output of the first element that was commanded to disable; and in response to sensing the subsequent alarm state at the output of the first element that was commanded to disable, commanding, by the fault processing subsystem, an element at a next higher level in the hierarchy from the first element to disable.

2. The method of claim 1, wherein the fault processing subsystem comprises a plurality of discrete logic gates, and wherein each commanding step is performed by the discrete logic gates.

3. The method of claim 1, further comprising:

sensing, by the fault processing subsystem, an output of each element in the hierarchy over a first period of time, prior to sensing the output of each element in the hierarchy over the first period of time, establishing for each such element, by the fault processing subsystem, a profile characterizing a non-alarm state of operation of each such element;

establishing, by the fault processing subsystem for each profiled element, a limit condition based on the profile of the profiled element, each limit condition being less than the alarm state of the profiled element;

based on the sensing of the output of each element in the hierarchy over the first period of time, determining, by the fault processing subsystem, that a second particular element below the top hierarchy level is operating outside its limit condition;

commanding, by the fault processing subsystem, the second particular element determined to be operating outside its limit condition to reset;

after commanding the second particular element determined to be operating outside its limit condition to reset and based on the sensing of the output of each element in the hierarchy over the first period of time, determining, by the fault processing subsystem, that the second particular element continues to operate outside its limit condition; and in response to the determining that the second particular element continues to operate outside its limit condition, commanding, by the fault processing subsystem, an element at a next higher level in the hierarchy from the second particular element to disable.

4. The method of claim 3, wherein establishing the profile characterizing the non-alarm state of operation of each element comprises:

sensing, by the fault processing subsystem, an output of each element in the hierarchy over a period of time prior to the first period of time; and determining a profile characterizing a non-alarm state of operation of each element based on the sensed output of each element over the period of time prior to the first period of time.

5. The method of claim 3, wherein the at least one established limit condition comprises a limit condition as a function of time.

6. A computer program product, comprising:

a non-transitory computer-readable storage device having computer-executable program instructions embodied thereon that when executed by a computer cause the computer to:

first sense a first alarm state at an output of a first active power distribution element of a plurality of active power distribution elements arranged in a hierarchy in an electronics assembly, the first element being at a level of the hierarchy other than the top level, and the first alarm state corresponding to a value at the output of the first element different than an expected value at the output of the first element by at least a sum of a regulation margin of the first element, a noise margin of the first element, and a measurement accuracy of the fault processing system;

first command, in response to the first sensing, the first element first sensed to be in the alarm state to disable;

second sense a subsequent alarm state at the output of the first commanded element; and second command, in response to the second sensing, an element at the next higher level in the hierarchy from the first element second sensed to be in the subsequent alarm state to disable.

7. The computer program product of claim 6, wherein the instructions are encoded in a plurality of discrete logic gates, and each of first commanding and second commanding is performed by the discrete logic gates.

8. The computer program product of claim 6, that when executed is further operable to:

third sense the output of each element in the hierarchy over a first period of time, establish, prior to the third sensing, a profile characterizing a non-alarm state of operation of each element in the hierarchy;

establish, for each profiled element, a limit condition based on the profile of the profiled element, each limit condition being less than the alarm state of the profiled element;

first determine, based on the third sensing, that a second particular element below the top hierarchy level is operating outside its limit condition;

third command the second particular element determined to be operating outside its limit condition to reset;

second determine, after the third commanding and based on the third sensing, that the second particular element continues to operate outside its limit condition; and fourth command, in response to the second determining, an element at the next higher level in the hierarchy from the second particular element to disable.

9. The computer program product of claim 8, wherein establishing the profile characterizing the non-alarm state of operation of each element comprises:

fourth sensing the output of each element in the hierarchy over a period of time prior to the first period of time; and determining the profile characterizing the non-alarm state of operation of each element based on the fourth sensed output of each element.

10. The computer program product of claim 8, wherein the at least one established limit condition comprises a limit condition as a function of time.

11. An electronics assembly, comprising:

a hierarchy of active power distribution elements, the hierarchy comprising one top element at a top level, and at least one element at a lower level, each element comprising an output and a control input;

a fault processing subsystem, in communication with the control input of each element, the fault processing subsystem having encoded therein logic that when executed is operable to:

first sense a first alarm state at the output of a first element, the first element being at a level of the hierarchy other than the top level, and the first alarm state corresponding to a value at the output of the first element being different than an expected value at the output of the first element by at least a sum of a regulation margin of the first element, a noise margin of the first element, and a measurement accuracy of the fault processing system;

first command, in response to the first sensing, the first element to disable;

second sense, a subsequent alarm state at the output of the first commanded element; and second command, in response to the second sensing, an element at a next higher level in the hierarchy from the first element second sensed to be in the subsequent alarm state to disable.

12. The electronics assembly of claim 11, wherein the logic comprises a plurality of discrete logic gates, and wherein the first commanding is performed by at least one of the discrete logic gates.

13. The electronics assembly of claim 11:

wherein the logic, when executed, is further operable to:

third sense the output of each element in the hierarchy over a first period of time, and establish, prior to the third sensing, a profile characterizing a non-alarm state of operation of each element in the hierarchy;

establish, for each profiled element, a limit condition based on the profile of the profiled element, each limit condition being less than the alarm state of the profiled element;

first determine, based on the third sensing, that a second particular element below the top hierarchy level is operating outside its limit condition;

third command the second particular element determined to be operating outside its limit condition to reset;

second determine, after the third commanding and based on the third sensing, that the second particular element continues to operate outside its limit condition; and fourth command, in response to the second determining, an element at a next higher level in the hierarchy from the second particular element to disable.

14. The electronics assembly of claim 13, wherein establishing the profile characterizing the non-alarm state of operation of each element comprises:

fourth sensing, by the fault processing subsystem, the output of each element in the hierarchy over a period of time prior to the first period of time; and determining the profile characterizing the non-alarm state of operation of each element based on the fourth sensed power output of each element.

* * * * *